(12) United States Patent
Lee et al.

(10) Patent No.: US 12,396,332 B2
(45) Date of Patent: Aug. 19, 2025

(54) ELECTRONIC DEVICE AND METHOD OF MANUFACTURING THE SAME

(71) Applicant: Samsung Display Co., Ltd., Yongin-si (KR)

(72) Inventors: Che Ho Lee, Seoul (KR); Jinho Kwack, Hwaseong-si (KR); Seungwoo Seo, Hwaseong-si (KR); Young Seo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 504 days.

(21) Appl. No.: 17/837,026

(22) Filed: Jun. 10, 2022

(65) Prior Publication Data

US 2023/0059735 A1   Feb. 23, 2023

(30) Foreign Application Priority Data

Aug. 17, 2021   (KR) ................ 10-2021-0108201

(51) Int. Cl.
*H10K 59/122* (2023.01)
*H10K 50/84* (2023.01)
*H10K 71/00* (2023.01)
*H10K 59/12* (2023.01)

(52) U.S. Cl.
CPC .......... *H10K 59/122* (2023.02); *H10K 50/84* (2023.02); *H10K 71/00* (2023.02); *H10K 59/1201* (2023.02)

(58) Field of Classification Search
CPC ...... H10K 59/122; H10K 50/84; H10K 71/00; H10K 59/1201; H10K 59/873; H10K 50/844; H10K 50/8426; H10K 50/8428; H10K 59/123
See application file for complete search history.

(56) References Cited

U.S. PATENT DOCUMENTS

| | | | |
|---|---|---|---|
| 9,899,458 B2 | 2/2018 | Park | |
| 9,966,567 B2 | 5/2018 | Kim et al. | |
| 10,546,908 B2 | 1/2020 | Lee | |
| 10,777,767 B2 | 9/2020 | Nam | |
| 10,879,316 B2 * | 12/2020 | Lee | H10K 59/40 |
| 2014/0319479 A1 * | 10/2014 | Park | H10K 59/352 |
| | | | 257/40 |
| 2015/0060806 A1 * | 3/2015 | Park | H10K 59/873 |
| | | | 257/40 |

FOREIGN PATENT DOCUMENTS

| | | |
|---|---|---|
| KR | 10-2016-0036722 | 4/2016 |
| KR | 10-2016-0120869 | 10/2016 |

(Continued)

*Primary Examiner* — Marlon T Fletcher
*Assistant Examiner* — Samuel Jonathan Smith
(74) *Attorney, Agent, or Firm* — CANTOR COLBURN LLP

(57) ABSTRACT

An electronic device includes a base layer, a circuit layer disposed on the base layer and including a transistor and an insulating layer, a light emitting element layer disposed on the circuit layer, in which the light emitting layer includes a light emitting element including a first electrode, a light emitting layer, and a second electrode, a pixel definition layer including a first portion and a second portion, and a stopper layer disposed on the first portion, and an encapsulation layer disposed on the light emitting element layer.

19 Claims, 13 Drawing Sheets

(56) References Cited

FOREIGN PATENT DOCUMENTS

| | | |
|---|---|---|
| KR | 10-2018-0029845 | 3/2018 |
| KR | 1020180071122 A | 6/2018 |
| KR | 1020190057550 A | 5/2019 |
| KR | 1020190068954 A | 6/2019 |
| KR | 1020190079784 A | 7/2019 |
| KR | 10-2216680 | 2/2021 |

* cited by examiner

ELECTRONIC DEVICE AND METHOD OF MANUFACTURING THE SAME

CROSS-REFERENCE TO RELATED APPLICATION

This application claims priority from and the benefit of Korean Patent Application No. 10-2021-0108201, filed on Aug. 17, 2021, which is hereby incorporated by reference for all purposes as if fully set forth herein.

BACKGROUND

Field

Embodiments of the invention relate generally to an electronic device having reduced thickness and capable of reducing a size of a non-display area.

Discussion of the Background

Electronic devices that provide images to a user, such as televisions, monitors, smartphones, and tablet computers, include a display panel to display the images. A variety of display panels, such as a liquid crystal display (LCD) panel, an organic light emitting display (OLED) panel, an electrowetting display panel, an electrophoretic display panel, etc., are being developed.

The above information disclosed in this Background section is only for understanding of the background of the inventive concepts, and, therefore, it may contain information that does not constitute prior art.

SUMMARY

Devices constructed according to illustrative implementations of the invention are capable of improving reliability of a display device by use of a stopper layer to stop a polishing liquid used during manufacturing of the display device from infiltrating undesired areas of the device and thereby cause inadvertent damage to the device.

One or more inventive concepts consistent with one or more embodiments of the invention provide for an electronic device having reduced thickness and capable of reducing a size of a non-display area.

One or more inventive concepts consistent with one or more embodiments of the invention provide for a method of manufacturing the electronic device.

Additional features of the inventive concepts will be set forth in the description that follows, and in part will be apparent from the description, or may be learned by practice of the inventive concepts.

Embodiments provide an electronic device including a base layer, a circuit layer disposed on the base layer and including a transistor and an insulating layer, a light emitting element layer disposed on the circuit layer, including a light emitting element including a first electrode, a light emitting layer, and a second electrode, a pixel definition layer including a first portion and a second portion, and a stopper layer disposed on the first portion, and an encapsulation layer disposed on the light emitting element layer.

The stopper layer may include a metal material.

The stopper layer may include an inorganic material.

The stopper layer may have an inverted taper shape.

The stopper layer may not overlap the second electrode when viewed in a plane.

The encapsulation layer may include an inorganic material.

The encapsulation layer may be disposed directly on the stopper layer and the second electrode.

The second electrode may be disposed on the second portion.

The light emitting layer may not overlap the stopper layer when viewed in a plane.

The second electrode may be provided with an opening defined therethrough to overlap the first portion when viewed in a plane, and the stopper layer may be disposed in the opening.

An upper surface of the second electrode and an upper surface of the stopper layer may be defined on a same plane.

Embodiments provide a method of manufacturing an electronic device. The method includes providing a base layer, forming a circuit layer including a transistor and an insulating layer on the base layer, forming a light emitting element layer on the circuit layer, and forming an encapsulation layer on the light emitting element layer. The forming of the light emitting element layer includes forming a first electrode electrically connected to the transistor, forming a pixel definition layer including a first portion and a second portion on the circuit layer, forming an opening through the pixel definition layer, forming a stopper layer on the first portion, forming a light emitting layer in the opening, and forming a second electrode on the light emitting layer, the pixel definition layer, and the stopper layer.

The forming of the light emitting element layer may further include forming a spacer on the stopper layer, forming an inorganic layer on the spacer and the second electrode, and polishing the spacer and the inorganic layer.

The polishing of the spacer and the inorganic layer may be carried out until the stopper layer is exposed.

The polishing of the spacer and the inorganic layer may be carried out such that an upper surface of the inorganic layer is defined on a same plane as an upper surface of each of the second electrode and the stopper layer.

The polishing of the spacer and the inorganic layer may include removing the spacer.

The first portion overlaps the stopper layer, and the second portion may overlap the second electrode when viewed in a plane.

The forming of the stopper layer on the first portion of the pixel definition layer may include forming the stopper layer with a metal material.

The forming of the stopper layer on the first portion of the pixel definition layer may include forming the stopper layer with an inorganic material.

The stopper layer may have an inverted taper shape by the forming of the stopper layer on the first portion of the pixel definition layer.

According to the above, the upper surface of the inorganic layer, the upper surface of the second electrode, and the upper surface of the stopper layer are planarized by the polishing process. The encapsulation layer including the inorganic material is disposed on the planarized light emitting element layer. The encapsulation layer does not include an organic material. Thus, a thickness of the encapsulation layer decreases. In addition, it is not required to include a separate component to control a flow of the organic material in the non-display area. A size of the non-display area is reduced. Accordingly, a thickness of the electronic device is reduced and a size of the non-display area decreases in the electronic device.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

The above and other advantages of the embodiments described hereinbelow will become readily apparent by reference to the following detailed description when considered in conjunction with the accompanying drawings wherein.

DETAILED DESCRIPTION

Figure 1:
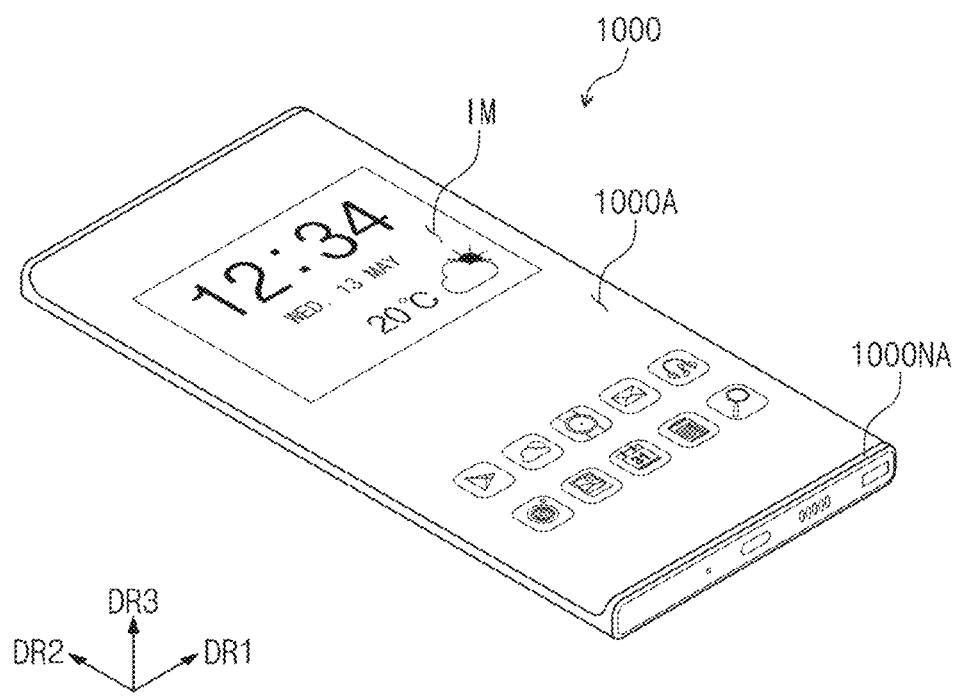
FIG. 1 is a perspective view showing an electronic device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be explained in detail with reference to the accompanying drawings.

FIG. 1 is a perspective view showing an electronic device 1000 according to an embodiment that is constructed according to principles of the invention.

Referring to FIG. 1, the electronic device 1000 may be a device activated in response to electrical signals. For example, the electronic device 1000 may be a mobile phone, a tablet computer, a car navigation unit, a game unit, or a wearable unit; however, it should not be limited thereto or thereby. FIG. 1 shows the mobile phone as a representative example of the electronic device 1000.

The electronic device 1000 may include an active area 1000A and a non-display area (also referred to herein as 'peripheral area') 1000NA.

The active area 1000A may be an area through which an image IM is displayed. The active area 1000A may include a plane defined by a first direction DR1 and a second direction DR2 orthogonal to or substantially orthogonal to the first direction DR1. The active area 1000A may further include curved surfaces respectively bent from at least two side portions of the plane. However, the shape of the active area 1000A should not be limited thereto or thereby. For example, the active area 1000A may include only the plane or may further include two or more curved surfaces, e.g., four curved surfaces respectively bent from four side portions of the plane.

The peripheral area 1000NA may be defined adjacent to the active area 1000A. The peripheral area 1000NA may surround the active area 1000A. However, this is merely one example, and the shape of the active area 1000A and the shape of the peripheral area 1000NA may be designed relative to each other. According to an embodiment, the peripheral area 1000NA may be omitted. The peripheral area 1000NA may be referred to as a non-display area 1000NA.

A third direction DR3 may indicate a thickness direction of the electronic device 1000. The third direction DR3 may cross the first direction DR1 and the second direction DR2. Front (or upper) and rear (or lower) surfaces of each member of the electronic device 1000 may be distinguished from each other in the third direction DR3. The expression "when viewed in a plane" may denote a state of being viewed in the third direction DR3.

Figure 2:
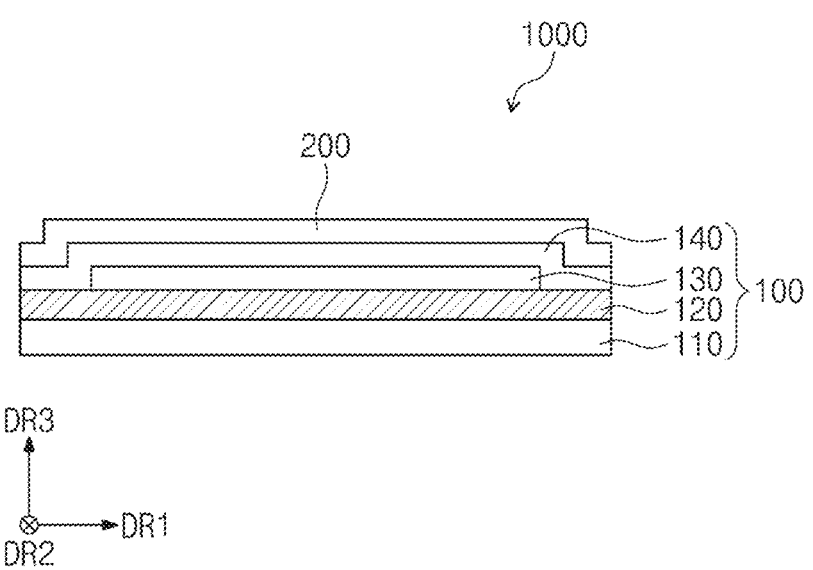
FIG. 2 is a cross-sectional view showing an electronic device according to an embodiment.

FIG. 2 is a cross-sectional view showing the electronic device 1000 according to an embodiment.

Referring to FIG. 2, the electronic device 1000 may include a display layer 100 and a sensor layer 200.

The display layer 100 may be a light emitting type display layer, however, it should not be particularly limited. For example, the display layer 100 may be an organic light emitting display layer, a quantum dot display layer, a micro-LED display layer, or a nano-LED display layer. A light emitting layer of the organic light emitting display layer may include an organic light emitting material. A light emitting layer of the quantum dot display layer may include a quantum dot or a quantum rod. A light emitting layer of the micro-LED display layer may include a micro-LED. A light emitting layer of the nano-LED display layer may include a nano-LED.

The display layer 100 may include a base layer 110, a circuit layer 120, a light emitting element layer 130, and an encapsulation layer 140.

The base layer 110 may provide a base surface on which the circuit layer 120 is disposed. The base layer 110 may be a glass substrate, a metal substrate, or a polymer substrate, however, it should not be limited thereto or thereby. According to an embodiment, the base layer 110 may be an inorganic layer, an organic layer, or a composite material layer.

The base layer 110 may have a multi-layer structure. For instance, the base layer 110 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the embodiments described herein, the term "X-based resin", as used herein, refers to the resin that includes a functional group of X.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes. Thus, the semiconductor pattern, the conductive pattern, and the signal line included in the circuit layer 120 may be formed.

The light emitting element layer 130 may be disposed on the circuit layer 120. The light emitting element layer 130 may include a light emitting element. As an example, the light emitting element layer 130 may include an organic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles.

The sensor layer 200 may be formed on the display layer 100 through successive processes. In this case, the sensor layer 200 may be disposed directly on the display layer 100. In the embodiments described herein, the expression "the sensor layer 200 is disposed directly on the display layer 100" denotes that no intervening elements are present between the sensor layer 200 and the display layer 100. That is, a separate adhesive member may not be disposed between the sensor layer 200 and the display layer 100. According to an embodiment, the sensor layer 200 may be coupled to the display layer 100 by an adhesive member. The adhesive member may include an ordinary adhesive.

Figure 3:
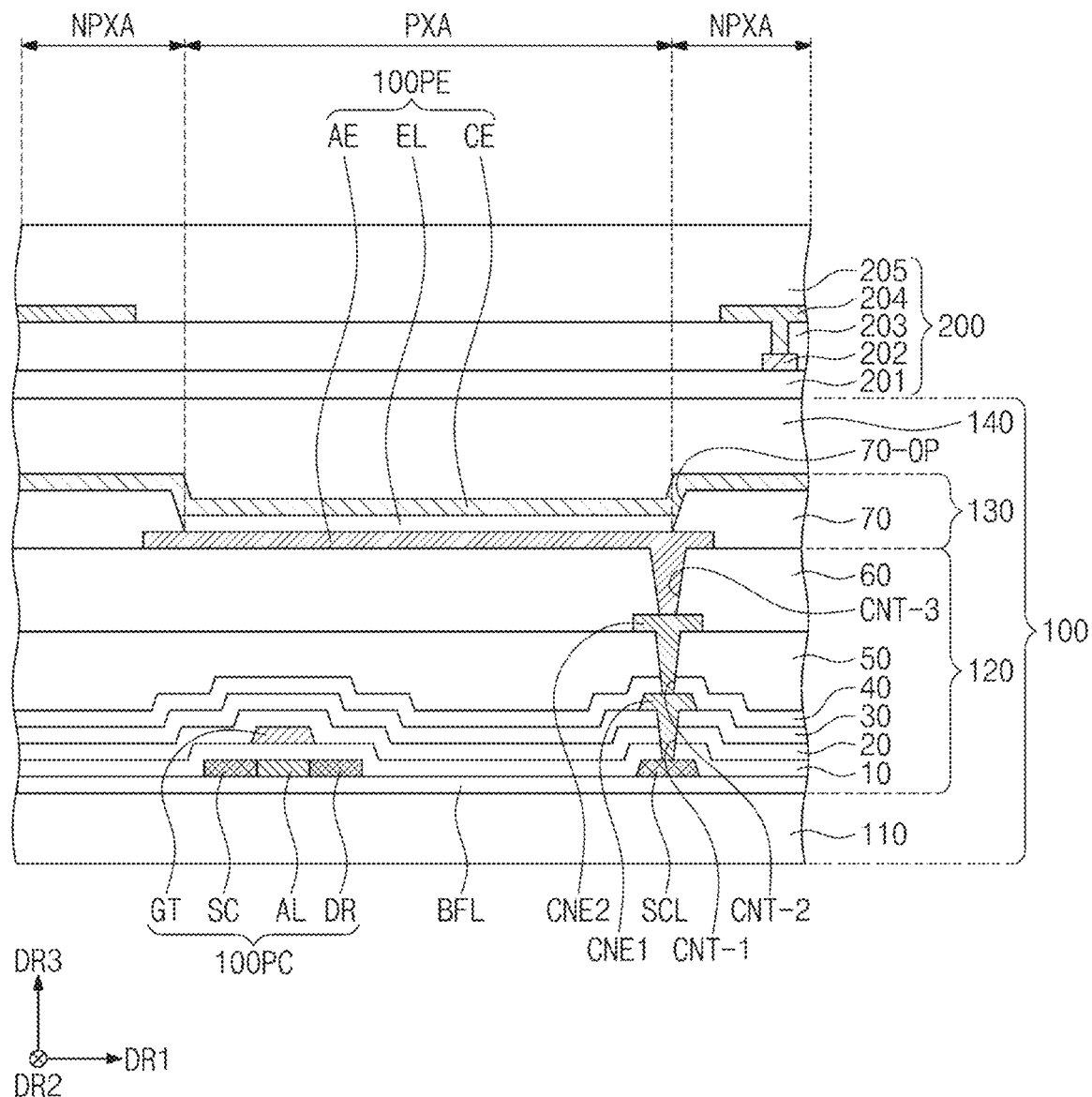
FIG. 3 is a cross-sectional view showing a portion of an electronic device according to an embodiment.

FIG. 3 is a cross-sectional view showing a portion of the electronic device according to an embodiment.

Referring to FIG. 3, the display layer 100 may include the base layer 110, the circuit layer 120, the light emitting element layer 130, and the encapsulation layer 140.

The base layer 110 may provide the base surface on which the circuit layer 120 is disposed. The base layer 110 may be the glass substrate, the metal substrate, or the polymer substrate, however, it should not be limited thereto or thereby. According to an embodiment, the base layer 110 may be the inorganic layer, the organic layer, or the composite material layer.

The base layer 110 may have the a multi-layer structure. For instance, the base layer 110 may include the first synthetic resin layer, the silicon oxide ($SiO_x$) layer disposed on the first synthetic resin layer, the amorphous silicon (a-Si) layer disposed on the silicon oxide layer, and the second synthetic resin layer disposed on the amorphous silicon layer. The silicon oxide layer and the amorphous silicon layer may be referred to as the base barrier layer.

Each of the first and second synthetic resin layers may include the polyimide-based resin. In addition, each of the first and second synthetic resin layers may include at least one of the acrylic-based resin, the methacrylic-based resin, the polyisoprene-based resin, the vinyl-based resin, the epoxy-based resin, the urethane-based resin, the cellulose-based resin, the siloxane-based resin, the polyamide-based resin, and the perylene-based resin. In the embodiments described herein, the term "X-based resin", as used herein, refers to the resin that includes a functional group of X.

At least one inorganic layer may be formed on an upper surface of the base layer 110. The inorganic layer may include at least one of aluminum oxide, titanium oxide, silicon oxide, silicon nitride, silicon oxynitride, zirconium oxide, and hafnium oxide. The inorganic layer may be formed in multiple layers. The inorganic layers may form a barrier layer and/or a buffer layer. In the embodiment described herein, the display layer 100 may include a buffer layer BFL.

The buffer layer BFL may increase a coupling force between the base layer 110 and the semiconductor pattern. The buffer layer BFL may include at least one of silicon oxide, silicon nitride, and silicon oxynitride. For example, the buffer layer BFL may have a stack structure in which a silicon oxide layer and a silicon nitride layer are alternately stacked with each other.

The semiconductor pattern may be disposed on the buffer layer BFL. The semiconductor pattern may include polysilicon, however, it should not be limited thereto or thereby. The semiconductor pattern may include amorphous silicon, low temperature polycrystalline silicon, or oxide semiconductor.

FIG. 3 shows only a portion of the semiconductor pattern, and the semiconductor pattern may be further disposed in other areas. The semiconductor pattern may be arranged with a specific rule over pixels. The semiconductor pattern may have different electrical properties depending on whether it is doped or not or whether it is doped with an N-type dopant or a P-type dopant. The semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or signal line. The second region may substantially correspond to an active area of the transistor. In other words, a portion of the semiconductor pattern may be the active area of the transistor, another portion of the semiconductor pattern may be a source area or a drain area of the transistor, and the other portion of the semiconductor pattern may be a connection electrode or a connection signal line.

Each of the pixels may have an equivalent circuit that includes seven transistors, one capacitor, and a light emitting element, and the equivalent circuit of the pixel may be changed in various ways. FIG. 3 shows one transistor 100PC and the light emitting element 100PE included in the pixel.

The source area SC, the active area AL, and the drain area DR of the transistor 100PC may be formed from the semiconductor pattern. The source area SC and the drain area DR may extend in opposite directions to each other from the active area AL in a cross-section. FIG. 3 shows a portion of a connection signal line SCL formed from the semiconductor pattern. The connection signal line SCL may be connected to the drain area DR of the transistor 100PC in a plane.

A first insulating layer 10 may be disposed on the buffer layer BFL. The first insulating layer 10 may overlap the pixels and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In the embodiment described herein, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, it should not be limited thereto or thereby.

A gate GT of the transistor 100PC may be disposed on the first insulating layer 10. The gate GT may be a portion of a metal pattern. The gate GT may overlap the active area AL. The gate GT may be used as a mask in a process of doping the semiconductor pattern.

A second insulating layer 20 may be disposed on the first insulating layer 10 and may cover the gate GT. The second insulating layer 20 may overlap the pixels. The second insulating layer 20 may be an inorganic layer and/or an organic layer and may have a single-layer or multi-layer structure. The second insulating layer 20 may include at least one of silicon oxide, silicon nitride, and silicon oxynitride. In the embodiment described herein, the second insulating layer 20 may have a multi-layer structure of a silicon oxide layer and a silicon nitride layer.

A third insulating layer 30 may be disposed on the second insulating layer 20. The third insulating layer 30 may have a single-layer or multi-layer structure. As an example, the third insulating layer 30 may have a multi-layer structure of a silicon oxide layer and a silicon nitride layer.

A first connection electrode CNE1 may be disposed on the third insulating layer 30. The first connection electrode CNE1 may be connected to the connection signal line SCL via a contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE. The light emitting element layer 130 may include an organic light emitting material, a quantum dot, a quantum rod, a micro-LED, or a nano-LED. Hereinafter, the organic light emitting element will be described as the light emitting element 100PE, however, it should not be particularly limited.

The light emitting element 100PE may include a first electrode AE, a light emitting layer EL, and a second electrode CE.

The first electrode AE may be disposed on the sixth insulating layer 60. The first electrode AE may be connected to the second connection electrode CNE2 via a contact hole CNT-3 defined through the sixth insulating layer 60.

A pixel definition layer 70 may be disposed on the sixth insulating layer 60 and may cover a portion of the first electrode AE. The pixel definition layer 70 may be provided with an opening 70-OP defined through. At least a portion of the first electrode AE may be exposed through the opening 70-OP of the pixel definition layer 70.

The active area 1000A (refer to FIG. 1) may include a light emitting area PXA and a non-light-emitting area NPXA adjacent to the light emitting area PXA. The non-light-emitting area NPXA may surround the light emitting area PXA. In the embodiment described herein, the light emitting area PXA may be defined to correspond to the portion of the first electrode AE exposed through the opening 70-OP.

The light emitting layer EL may be disposed on the first electrode AE. The light emitting layer EL may be disposed in an area corresponding to the opening 70-OP. That is, the light emitting layer EL may be formed in each of the pixels after being divided into plural portions. In the case where the light emitting layer EL is formed in each of the pixels after being divided into plural portions, each of the light emitting layers EL may emit a light having at least one of blue, red, and green colors, however, it should not be limited thereto or thereby. According to an embodiment, the light emitting layer EL may be connected to be provided over the pixels without being divided into plural portions. In this case, the light emitting layer EL may provide a blue light or a white light.

The second electrode CE may be disposed on the light emitting layer EL. The second electrode CE may have an integral shape and may be disposed over the pixels.

A hole control layer may be disposed between the first electrode AE and the light emitting layer EL. The hole control layer may be disposed in the light emitting area PXA and the non-light-emitting area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be formed in the plural pixels using an open mask.

The encapsulation layer 140 may be disposed on the light emitting element layer 130. The encapsulation layer 140 may include only an inorganic layer, however, layers of the encapsulation layer 140 should not be limited thereto or thereby.

The inorganic layers may protect the light emitting element layer 130 from moisture and oxygen, and the inorganic layers may include a silicon nitride layer, a silicon oxynitride layer, a silicon oxide layer, a titanium oxide layer, or an aluminum oxide layer.

The sensor layer 200 may include a base layer 201, a first conductive layer 202, a sensing insulating layer 203, a second conductive layer 204, and a cover insulating layer 205.

The base layer 201 may be an inorganic layer including at least one of silicon nitride, silicon oxynitride, and silicon oxide. According to an embodiment, the base layer 201 may be an organic layer including an epoxy-based resin, an acryl-based resin, or an imide-based resin. The base layer 201 may have a single-layer structure or a multi-layer structure of layers stacked in the third direction DR3.

Each of the first conductive layer 202 and the second conductive layer 204 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (IZTO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

At least one of the sensing insulating layer 203 and the cover insulating layer 205 may include an inorganic material. The inorganic material may include at least one of aluminum oxide, titanium oxide, silicon oxide, silicon oxynitride, zirconium oxide, and hafnium oxide.

At least one of the sensing insulating layer 203 and the cover insulating layer 205 may include an organic material. The organic material may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 4:
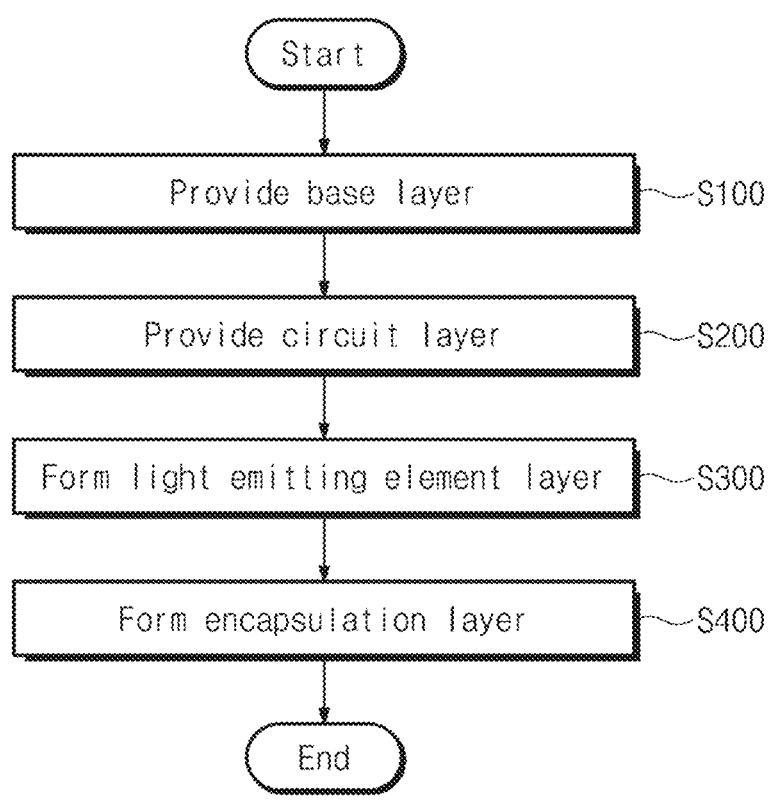
FIG. 4 is a flowchart showing a method of manufacturing an electronic device according to an embodiment.
Figure 5:
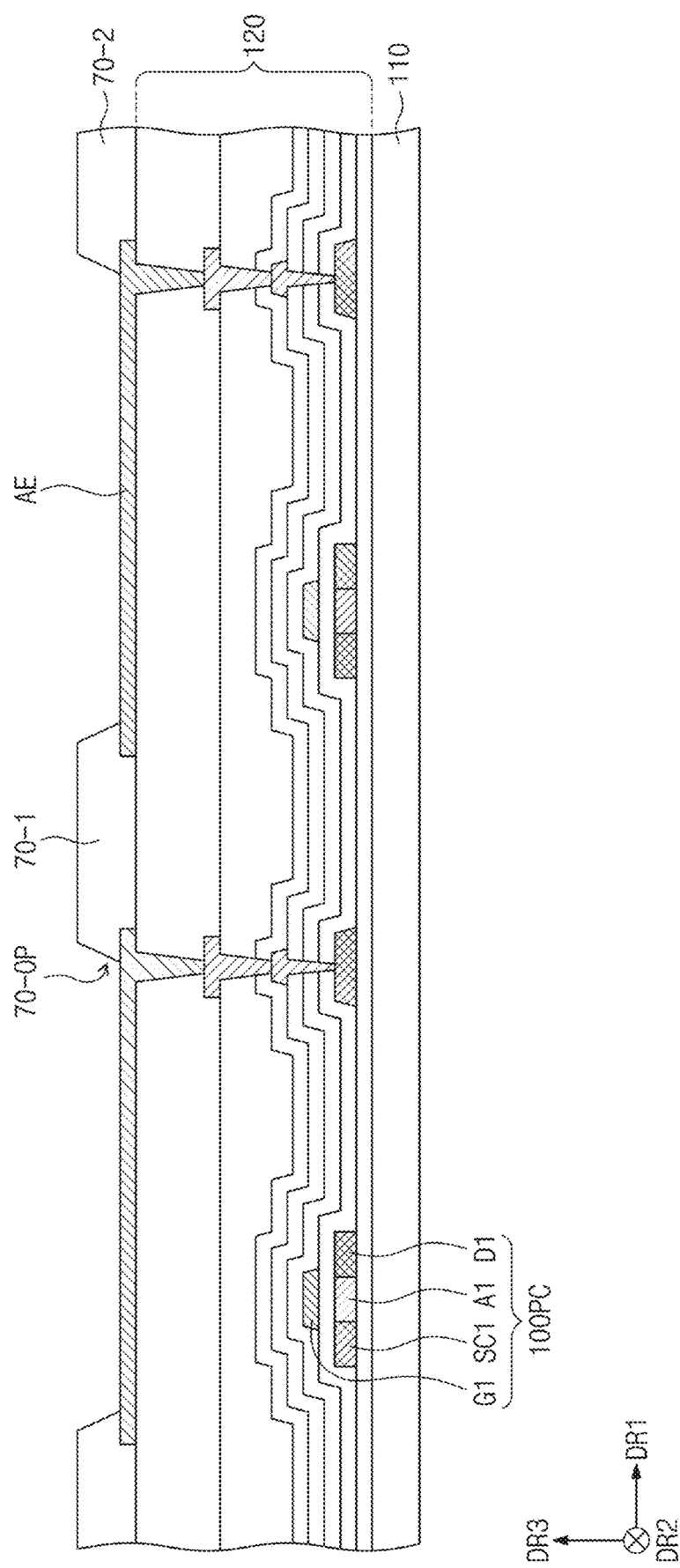
FIG. 5 is a cross-sectional view showing a process of forming a light emitting element layer according to an embodiment.

FIG. 4 is a flowchart showing a method of manufacturing the electronic device according to an embodiment. FIG. 5 is a cross-sectional view showing a process of forming the light emitting element layer according to an embodiment.

Referring to FIGS. 4 and 5, the base layer 110 may be provided (S100). The circuit layer 120 may be formed on the base layer 110 (S200).

The light emitting element layer 130 may be formed on the circuit layer 120 (S300).

The first electrode AE may be formed on the circuit layer 120. The first electrode AE may be electrically connected to the transistor 100PC.

The pixel definition layer 70 may be formed on the circuit layer 120. The opening 70-OP may be formed through the pixel definition layer 70. The pixel definition layer 70 may include a first portion 70-1 and a second portion 70-2, which are defined by the opening 70-OP.

Figure 6:
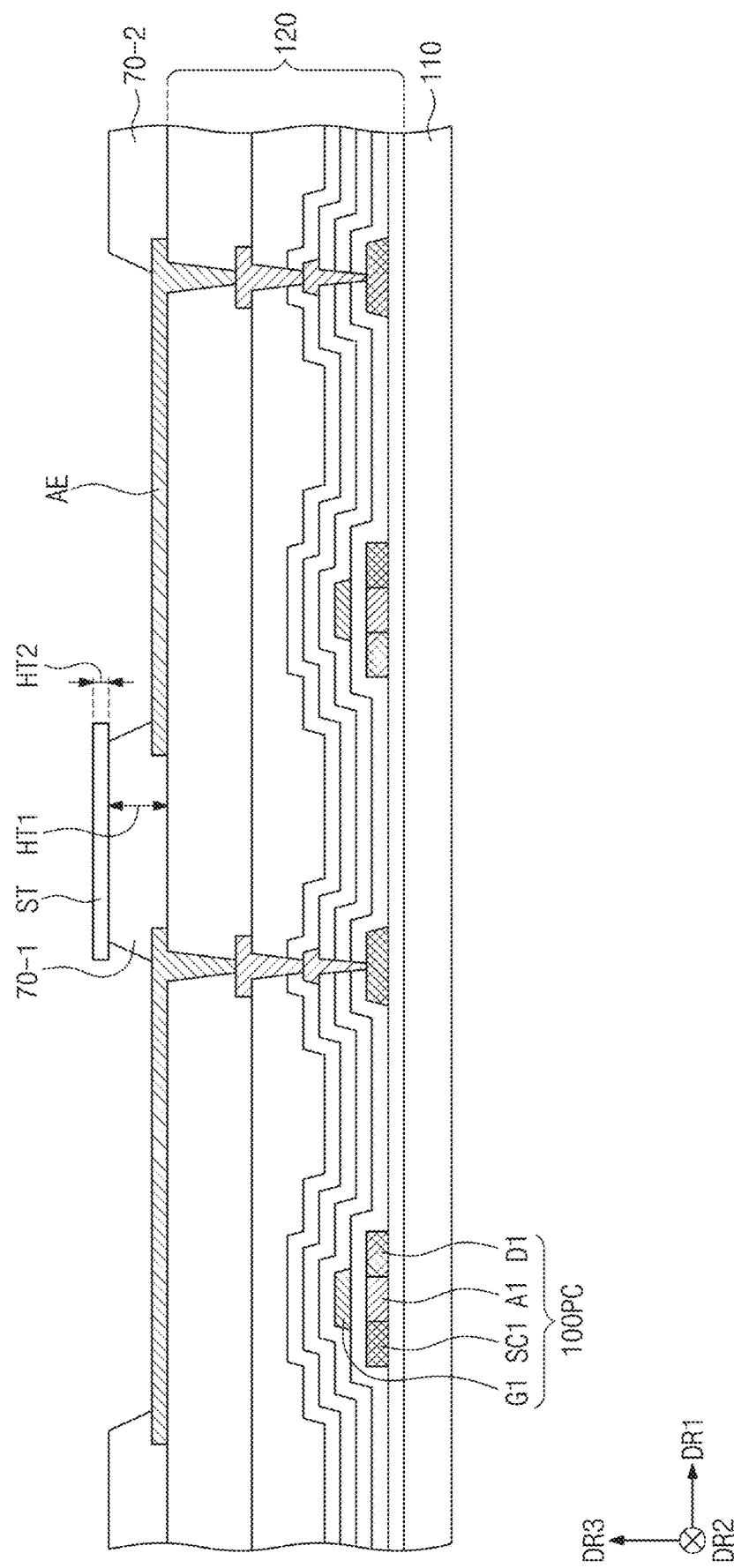
FIG. 6 is a cross-sectional view showing a process of forming a light emitting element layer according to an embodiment.
Figure 7:
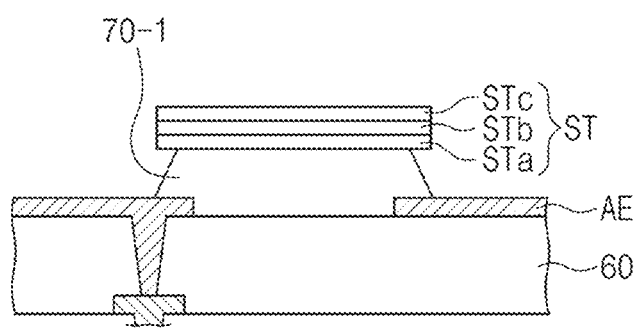
FIG. 7 is an enlarged cross-sectional view showing a portion of FIG. 6.
Figure 7:
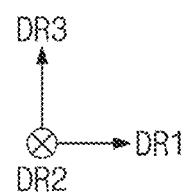

FIG. 6 is a cross-sectional view showing a process of forming the light emitting element layer according to an embodiment, and FIG. 7 is an enlarged cross-sectional view showing a portion of FIG. 6.

Referring to FIGS. 4, 6, and 7, a stopper layer ST may be formed on the first portion 70-1.

Each of the first portion 70-1 and the second portion 70-2 may have a first thickness HT1. The first thickness HT1 may be within a range from about 0.6 μm to about 0.8 μm. As an example, the first thickness HT1 may be about 0.7 μm.

The stopper layer ST may have a second thickness HT2 smaller than the first thickness HT1. The second thickness HT2 may be within a range from about 0.3 μm to about 0.4 μm. As an example, the second thickness HT2 may be about 0.37 μm.

The stopper layer ST may include a metal material. The stopper layer ST may include a first layer STa, a second layer STb, and a third layer STc, which are sequentially stacked. The first layer STa may include titanium. The second layer STb may include aluminum. The third layer STc may include titanium. That is, the stopper layer ST may have a three-layer structure of titanium/aluminum/titanium.

In addition, the first layer STa may include indium tin oxide. The second layer STb may include silver. The third layer STc may include indium tin oxide. That is, the stopper layer ST may have a three-layer structure of indium tin oxide/silver/indium tin oxide.

However, this is merely one example, and according to an embodiment, the stopper layer ST may include an inorganic material.

Figure 8:
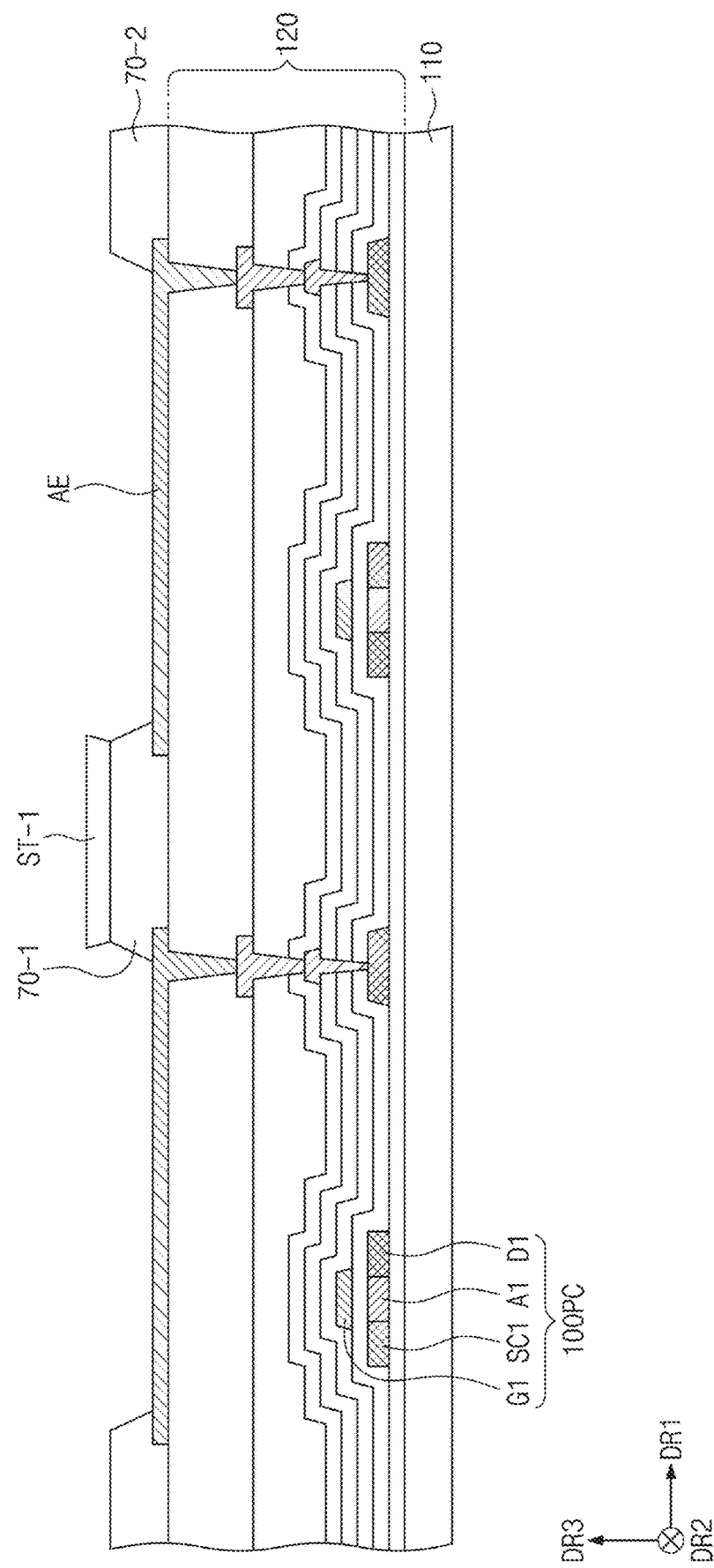
FIG. 8 is a cross-sectional view showing a process of forming a light emitting element layer according to an embodiment.

FIG. 8 is a cross-sectional view showing a process of forming a light emitting element layer according to an embodiment.

Referring to FIG. 8, a stopper layer ST-1 may be disposed on a first portion 70-1. The stopper layer ST-1 may include an inorganic material. The stopper layer ST-1 may have an inverted taper shape.

Figure 9:
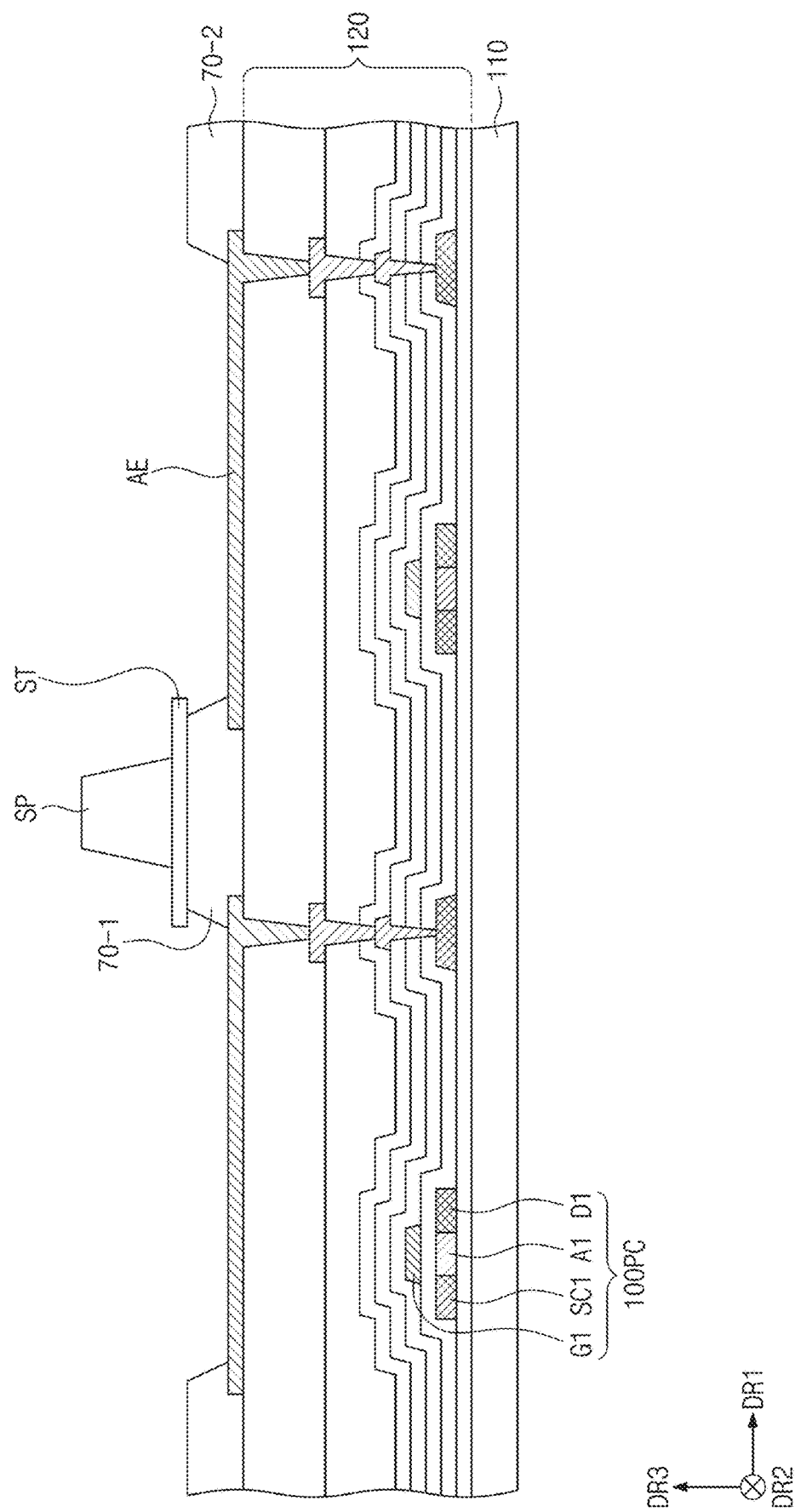
FIG. 9 is a cross-sectional view showing a process of forming a light emitting element layer according to an embodiment.
Figure 10:
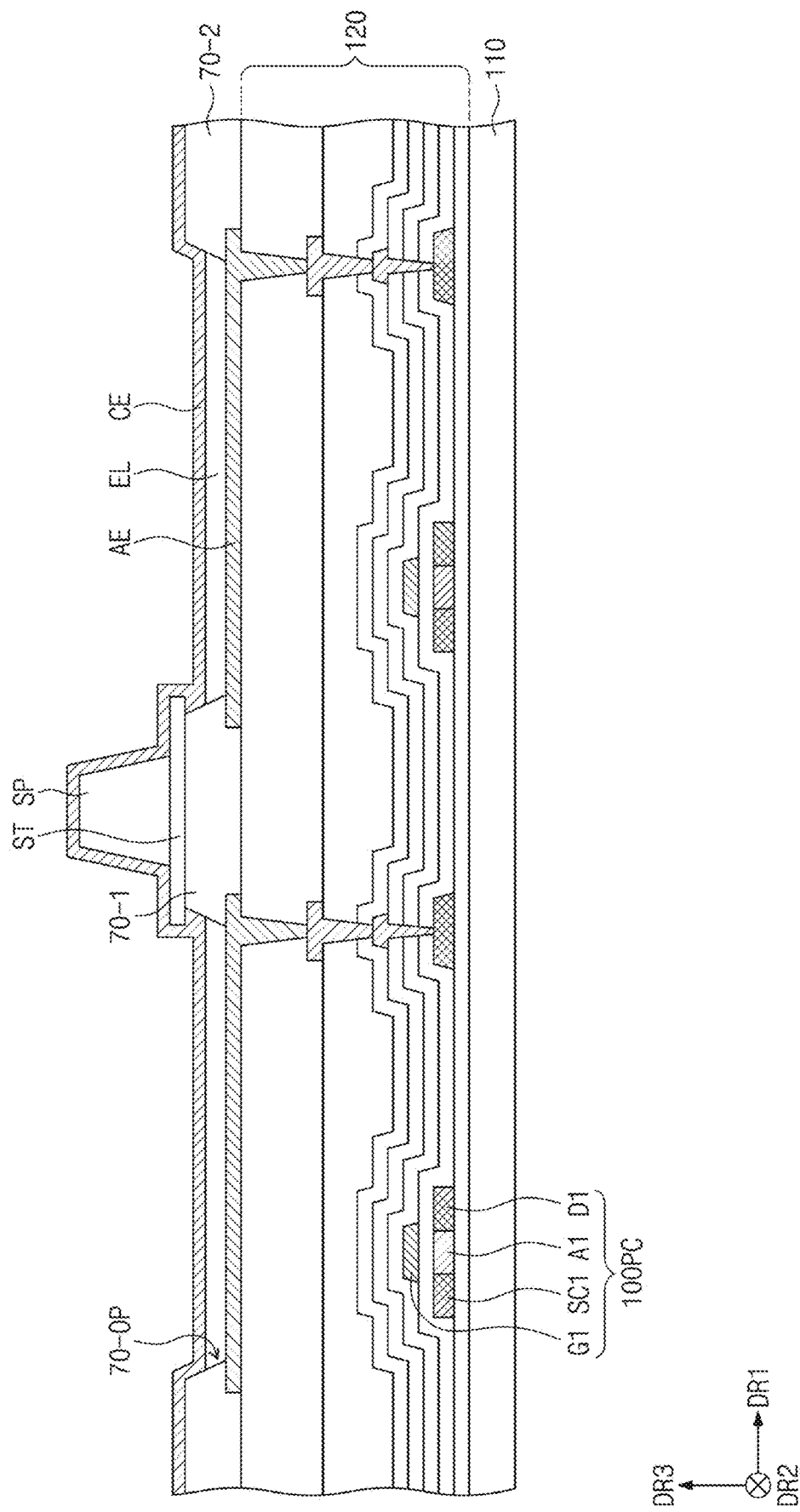
FIG. 10 is a cross-sectional view showing a process of forming a light emitting element layer according to an embodiment.

FIGS. 9 and 10 are cross-sectional views showing a process of forming the light emitting element layer according to an embodiment.

Referring to FIGS. 4, 9, and 10, a spacer SP may be disposed on the stopper layer ST. When viewed in a plane, the spacer SP may overlap the first portion 70-1.

The light emitting layer EL may be formed in the opening 70-OP. A mask may be disposed on the spacer SP to deposit the light emitting layer EL. The spacer SP may support the mask.

Different from the embodiments described herein, in a case where the electronic device 1000 is manufactured without the stopper layer ST, the electronic device 1000 may get scratches due to the mask. The first portion 70-1 of the pixel definition layer 70 (refer to FIG. 3) may be damaged. When manufacturing the electronic device, an organic material may permeate into damaged portions of the electronic device and may cause defects. However, according to an embodiment, the stopper layer ST may be disposed on the first portion 70-1, and the spacer SP may be disposed on the stopper layer ST. The stopper layer ST may protect the first portion 70-1. That is, the stopper layer ST may prevent the electronic device from getting scratches due to the mask in a deposition process. Accordingly, a reliability of the electronic device 1000 (refer to FIG. 1) may be improved.

The second electrode CE may be formed on the light emitting layer EL, the pixel definition layer 70 (refer to FIG. 3), the spacer SP, and the stopper layer ST. The second electrode CE may have an integral shape.

Figure 11:
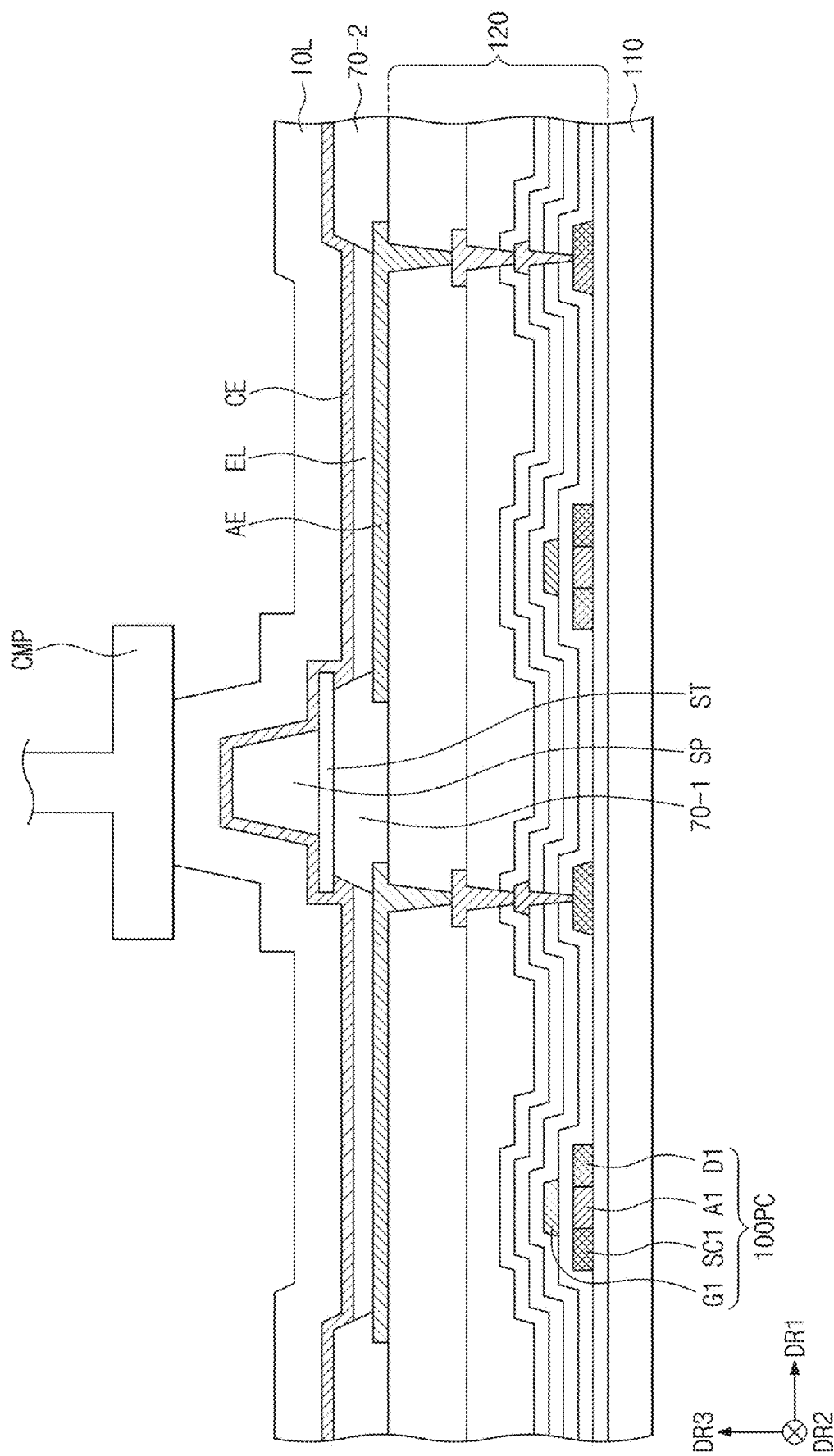
FIG. 11 is a cross-sectional view showing a process of forming a light emitting element layer according to an embodiment.
Figure 12:
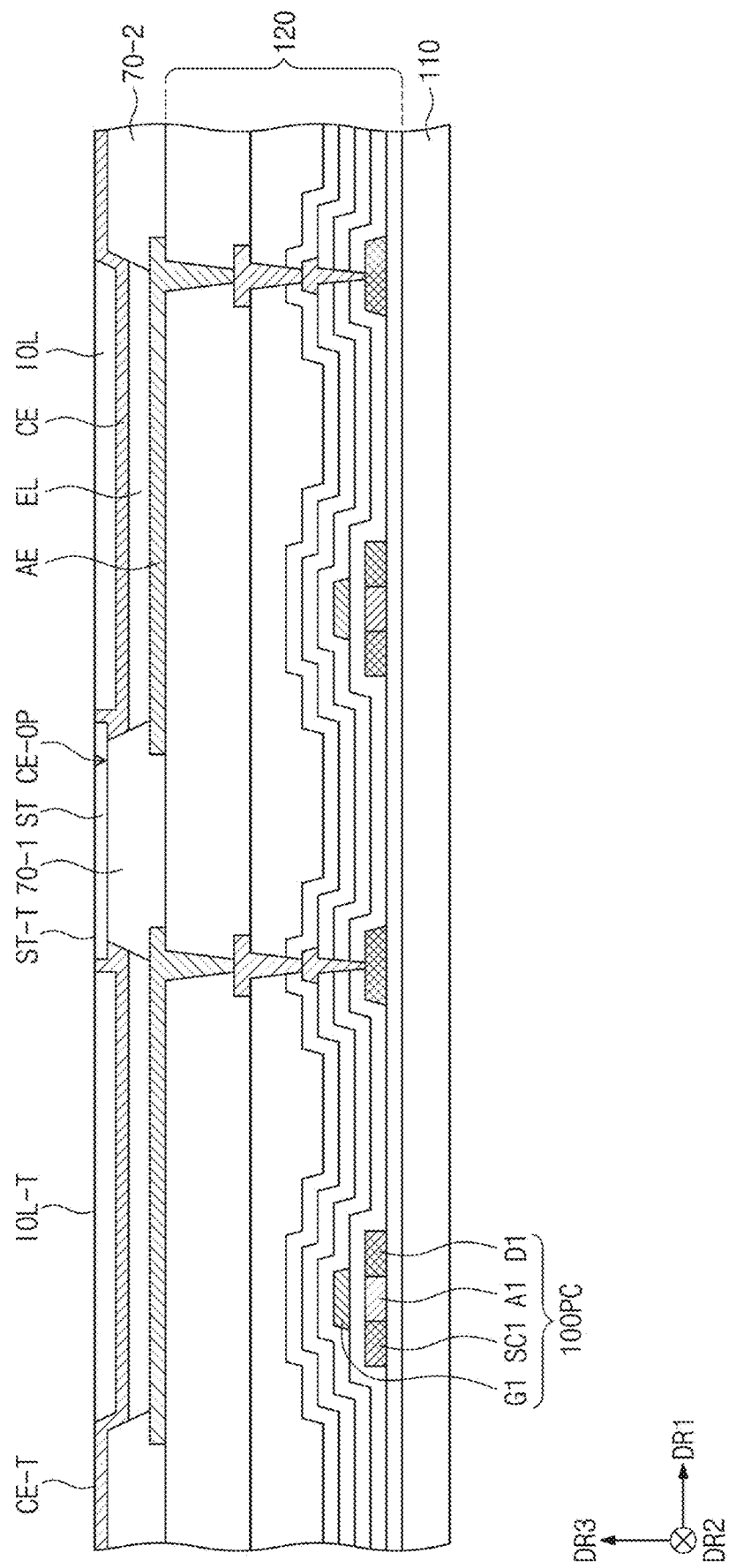
FIG. 12 is a cross-sectional view showing a process of forming a light emitting element layer according to an embodiment of the present disclosure.

FIGS. 11 and 12 are cross-sectional views showing a process of forming the light emitting element according to an embodiment.

Referring to FIGS. 4, 11, and 12, an inorganic layer IOL may be formed on the spacer SP and the second electrode CE.

A polisher CMP may be disposed on the inorganic layer IOL. The polisher CMP may polish the spacer SP and the inorganic layer IOL. The polisher CMP may perform a chemical mechanical polishing process. The chemical mechanical polishing process may include supplying a polishing agent and a polishing liquid to the polisher CMP in a state where the polisher CMP is pressed.

The polisher CMP may polish the spacer SP and the inorganic layer IOL until an upper surface ST-T of the stopper layer ST is exposed. The spacer SP may be removed while the polishing process is performed by the polisher CMP.

An upper surface IOL-T of the inorganic layer IOL may be defined on the same plane as an upper surface CE-T of the second electrode CE and the upper surface ST-T of the stopper layer ST. The plane may be a plane defined by the first direction DR1 and the second direction DR2.

After the polishing process is completed, an opening CE-OP may be defined through the second electrode CE to overlap the first portion 70-1, and the stopper layer ST may be disposed in the opening CE-OP when viewed in a plane. The stopper layer ST may not overlap the second electrode CE and the light emitting layer EL when viewed in a plane.

The stopper layer ST may be disposed on the first portion 70-1. The second electrode CE may be disposed on the second portion 70-2. That is, when viewed in a plane, the first portion 70-1 may overlap the stopper layer ST, and the second portion 70-2 may overlap the second electrode CE.

According to an embodiment, the stopper layer ST may stop the polishing process performed by the polisher CMP. In addition, the stopper layer ST may protect the first portion 70-1. That is, the stopper layer ST may prevent the polishing liquid from infiltrating into the first portion 70-1 in the polishing process. That is, the first portion 70-1 may be prevented from being defected due to the polishing liquid. Accordingly, the reliability of the electronic device 1000 (refer to FIG. 1) may be improved.

In addition, according to an embodiment, the upper surface IOL-T of the inorganic layer IOL, the upper surface CE-T of the second electrode CE, and the upper surface ST-T of the stopper layer ST may be defined on the same plane by the polishing process. That is, the upper surface IOL-T of the inorganic layer IOL, the upper surface CE-T of the second electrode CE, and the upper surface ST-T of the stopper layer ST may be planarized.

Figure 13:
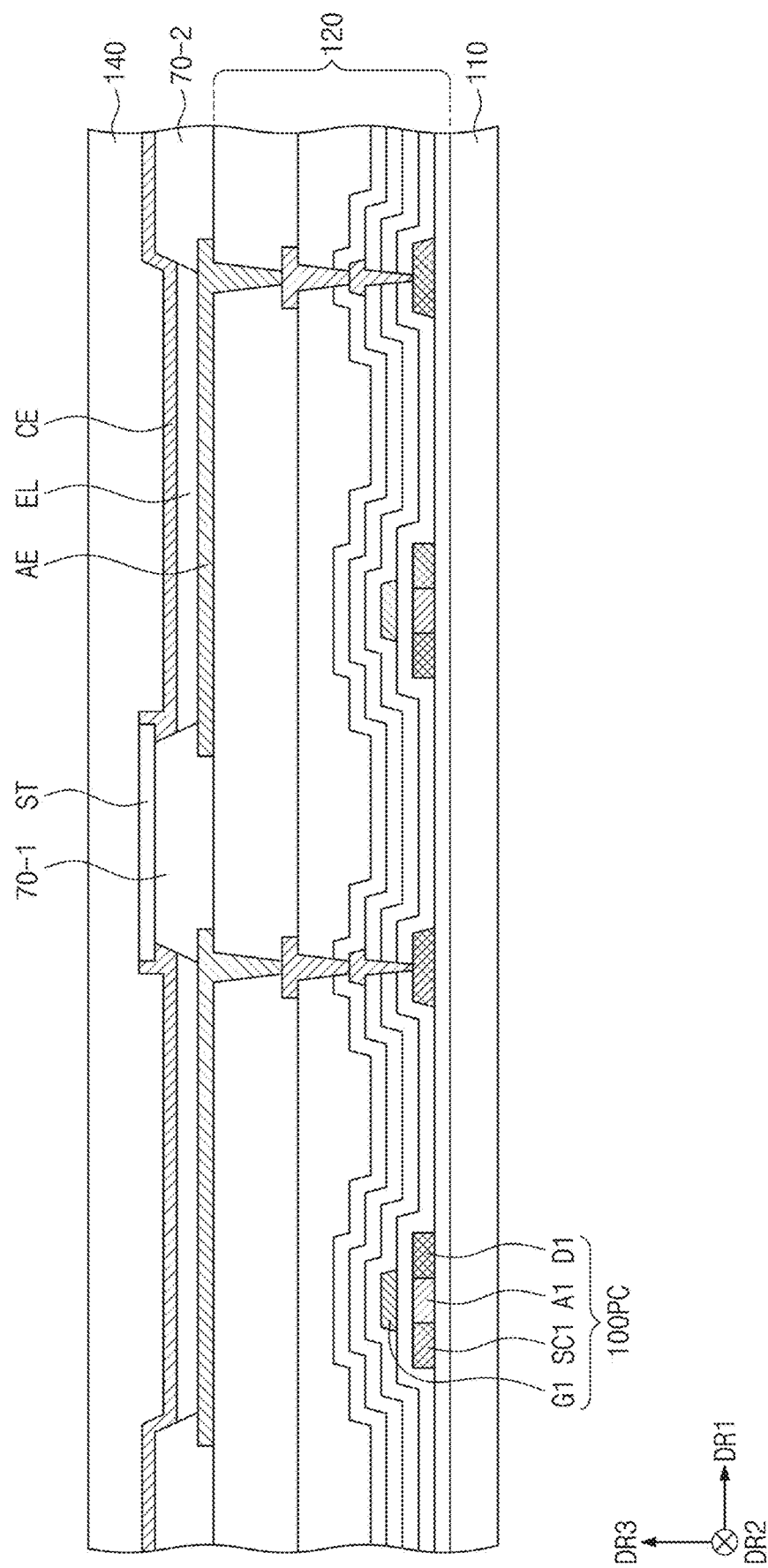
FIG. 13 is a cross-sectional view showing a process of forming an encapsulation layer according to an embodiment.

FIG. 13 is a cross-sectional view showing a process of forming the encapsulation layer according to an embodiment.

Referring to FIGS. 4 and 13, the encapsulation layer 140 may be formed on the second electrode CE and the stopper layer ST (S400). That is, the encapsulation layer 140 may be disposed on the light emitting element layer 130 (refer to FIG. 3).

The encapsulation layer 140 may be disposed directly on the stopper layer ST and the second electrode CE.

The encapsulation layer 140 may be provided integrally with the inorganic layer IOL. The encapsulation layer 140 may include only inorganic material, however, this is merely one example. According to an embodiment, a material for the encapsulation layer 140 should not be limited thereto or thereby.

Different from the embodiments described hereinabove, when the polishing process is not used, the encapsulation layer 140 may include an organic layer including an organic material to planarize an upper surface of the electronic device 1000. Due to the organic layer, the thickness of the encapsulation layer 140 may increase. In addition, a dam may be further disposed in the non-display area 1000NA (refer to FIG. 1) to control a flow of the organic material of the organic layer. In this case, a size of the non-display area 1000NA (refer FIG. 1) may increase. However, according to an embodiment, the upper surface IOL-T of the inorganic layer IOL, the upper surface CE-T of the second electrode CE, and the upper surface ST-T of the stopper layer ST may be planarized by the polishing process. The encapsulation layer 140 including the inorganic material may be disposed on the planarized light emitting element layer 130. The encapsulation layer 140 may not include the organic material. The thickness of the encapsulation layer 140 may decrease. In addition, a separate configuration to control the flow of the organic material may not be necessary in the non-display area 1000NA (refer to FIG. 1). The size of the non-display area 1000NA (refer to FIG. 1) may decrease. Accordingly, the thickness of the electronic device 1000 may decrease, and the size of the non-display area 1000NA (refer to FIG. 1) of the electronic device 1000 may be reduced.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
   a base layer;
   a circuit layer disposed on the base layer and comprising a transistor and an insulating layer;
   a light emitting element layer disposed on the circuit layer, the light emitting element layer comprising:
   a light emitting element that includes a first electrode having first and second peripheral edges at opposite sides thereof, a light emitting layer, and a second electrode,
   a pixel definition layer comprising a first terminal edge portion overlying the first peripheral edge of the first electrode and a second terminal edge portion overlying the second peripheral edge of the first electrode, and
   a stopper layer overlying at a terminal edge thereof the first terminal edge portion of the pixel definition layer and the first peripheral edge of the first electrode; and
   an encapsulation layer disposed on the light emitting element layer.

2. The electronic device of claim 1, wherein the stopper layer comprises at least one of a metal material and an inorganic material.

3. The electronic device of claim 1, wherein the stopper layer has an inverted taper shape.

4. The electronic device of claim 1, wherein the stopper layer does not overlap the second electrode when viewed in a plane.

5. The electronic device of claim 1, wherein the encapsulation layer comprises an inorganic material.

6. The electronic device of claim 1, wherein the encapsulation layer is disposed directly on the stopper layer and the second electrode.

7. The electronic device of claim 1, wherein the second electrode is disposed on the second terminal edge portion.

8. The electronic device of claim 1, wherein the light emitting layer does not overlap the stopper layer when viewed in a plane.

9. The electronic device of claim 1, wherein the second electrode is provided with an opening defined therethrough to overlap the first terminal edge portion when viewed in a plane, and the stopper layer is disposed in the opening.

10. The electronic device of claim 1, wherein an upper surface of the second electrode and an upper surface of the stopper layer are defined on a same plane.

11. A method of manufacturing an electronic device according to the electronic device of claim 1, the method comprising:
   providing the base layer;
   forming the circuit layer comprising the transistor and the insulating layer on the base layer;
   forming the light emitting element layer on the circuit layer; and forming the encapsulation layer on the light emitting element layer, the forming of the light emitting element layer comprising:
  forming the first electrode electrically connected to the transistor;
  forming the pixel definition layer comprising the first terminal edge portion and the second terminal edge portion on the circuit layer;
  forming an opening through the pixel definition layer;
  forming the stopper layer on the first terminal edge portion;
  forming the light emitting layer in the opening; and
  forming the second electrode on the light emitting layer, the pixel definition layer, and the stopper layer.

12. The method of claim 11, wherein the forming of the light emitting element layer further comprises:
  forming a spacer on the stopper layer;
  forming an inorganic layer on the spacer and the second electrode; and
  polishing the spacer and the inorganic layer.

13. The method of claim 12, wherein the polishing of the spacer and the inorganic layer is carried out until the stopper layer is exposed.

14. The method of claim 12, wherein the polishing of the spacer and the inorganic layer is carried out such that an upper surface of the inorganic layer is defined on a same plane as an upper surface of each of the second electrode and the stopper layer.

15. The method of claim 12, wherein the polishing of the spacer and the inorganic layer comprises removing the spacer.

16. The method of claim 11, wherein the first terminal edge portion overlaps the stopper layer, and the second terminal edge portion overlaps the second electrode when viewed in a plane.

17. The method of claim 11, wherein the forming of the stopper layer on the first terminal edge portion comprises forming the stopper layer with at least one of a metal material and an inorganic material.

18. The method of claim 11, wherein the stopper layer has an inverted taper shape by the forming of the stopper layer on the first terminal edge portion.

19. An electronic device comprising:
  a base layer;
  a circuit layer disposed on the base layer and comprising a transistor and an insulating layer; and
  a light emitting element layer disposed on the circuit layer and comprising:
    a light emitting element that includes a first electrode having first and second peripheral edges at opposite sides thereof, a light emitting layer, and a second electrode,
    a pixel definition layer comprising a first portion overlying at an edge thereof the first peripheral edge of the first electrode and a second portion overlying at an edge thereof the second peripheral edge of the first electrode, and
    a stopper layer disposed on the first portion and overlying at an edge thereof the first peripheral edge of the first electrode,
    wherein the second electrode extends under, around and over the edge of the stopper layer.

* * * * *